United States Patent
Kuan et al.

(10) Patent No.: US 8,642,382 B2
(45) Date of Patent: Feb. 4, 2014

(54) INTEGRATED CIRCUIT PACKAGING SYSTEM WITH SUPPORT STRUCTURE AND METHOD OF MANUFACTURE THEREOF

(75) Inventors: Heap Hoe Kuan, Singapore (SG); Reza Argenty Pagaila, Singapore (SG); Rui Huang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 107 days.

(21) Appl. No.: 13/164,114

(22) Filed: Jun. 20, 2011

(65) Prior Publication Data

US 2012/0319262 A1    Dec. 20, 2012

(51) Int. Cl.
    *H01L 23/00*    (2006.01)
(52) U.S. Cl.
    USPC ............................................. 438/107
(58) Field of Classification Search
    USPC .................................. 257/686; 438/107–109
    See application file for complete search history.

(56) References Cited

U.S. PATENT DOCUMENTS

| | | | |
|---|---|---|---|
| 6,297,560 B1 | 10/2001 | Capote et al. | |
| 6,448,659 B1 | 9/2002 | Lee | |
| 6,664,643 B2 | 12/2003 | Emoto | |
| 6,958,259 B2 | 10/2005 | Shibue | |
| 6,982,491 B1 * | 1/2006 | Fan et al. | 257/778 |
| 7,268,418 B2 | 9/2007 | Wang | |
| 7,521,809 B2 * | 4/2009 | Birzer et al. | 257/777 |
| 7,531,383 B2 * | 5/2009 | Lo et al. | 438/109 |
| 7,588,963 B2 | 9/2009 | Chao et al. | |
| 7,646,269 B2 | 1/2010 | Weister et al. | |
| 7,723,852 B1 * | 5/2010 | Kim et al. | 257/777 |
| 7,732,252 B2 * | 6/2010 | Chow et al. | 438/107 |
| 7,741,726 B2 * | 6/2010 | Jeon et al. | 257/790 |
| 7,749,808 B2 * | 7/2010 | Corisis et al. | 438/109 |
| 7,750,482 B2 * | 7/2010 | Pendse | 257/778 |
| 7,795,721 B2 * | 9/2010 | Kurita | 257/698 |
| 7,834,469 B2 * | 11/2010 | Chuang et al. | 257/790 |
| 7,906,855 B1 * | 3/2011 | Kim et al. | 257/777 |
| 8,350,381 B2 * | 1/2013 | Theuss | 257/723 |
| 2009/0001599 A1 | 1/2009 | Foong et al. | |

* cited by examiner

*Primary Examiner* — Nathan Ha
(74) *Attorney, Agent, or Firm* — Ishimaru & Associates LLP

(57) ABSTRACT

A method of manufacture of an integrated circuit packaging system includes: forming a mountable assembly includes: forming an integrated circuit device having a non-horizontal device side, an active device side, and a passive device side, providing a first integrated circuit die having an active side, a passive side, and an internal interconnect on the active side, applying a die attach adhesive on the passive side, attaching the passive side to the passive device side with the die attach adhesive, and applying an underfill on the passive device side and the internal interconnect, the underfill having a non-horizontal underfill side coplanar with the non-horizontal device side; and mounting on a substrate the mountable assembly.

8 Claims, 7 Drawing Sheets

INTEGRATED CIRCUIT PACKAGING SYSTEM WITH SUPPORT STRUCTURE AND METHOD OF MANUFACTURE THEREOF

TECHNICAL FIELD

The present invention relates generally to an integrated circuit packaging system, and more particularly to a system with a support structure.

BACKGROUND ART

Electronic products have become an integral part of our daily lives. This has created a consistent if not increasing expectation for new features, higher speed, more data, improved portability, etc. These demands have driven the development of electronic technology to reduce size, improve utility, decrease cost, and increase performance of the integrated circuit devices in an ever-increasing range of products such as cell phones, music players, televisions, and automobiles.

Packages of components such as semiconductor circuits, transistors, diodes, and other electronic devices must also become smaller and thinner with more functions and connections. In packaging components, manufacturing stacked integrated circuits in a manner that leads to high throughput and yield is essential.

However, mass-production of stacked integrated circuits is hampered by individual processing of each package. In addition, repeatability and reliability suffer if there are variations in individual unit processing.

Thus, a need still remains for a more efficient method of creating structures in an integrated circuit package. In view of the shrinking sizes of integrated circuits, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a mountable assembly including: forming an integrated circuit device having a non-horizontal device side, an active device side, and a passive device side, providing a first integrated circuit die having an active side, a passive side, and an internal interconnect on the active side, applying a die attach adhesive on the passive side, attaching the passive side to the passive device side with the die attach adhesive, and applying an underfill on the passive device side and the internal interconnect, the underfill having a non-horizontal underfill side coplanar with the non-horizontal device side; and mounting on a substrate the mountable assembly.

The present invention provides an integrated circuit packaging system, including: a mountable assembly including: an integrated circuit device having a non-horizontal device side, an active device side, and a passive device side, a first integrated circuit die having an active side, a passive side, and an internal interconnect on the active side, a die attach adhesive on and between the passive side and the passive device side, an underfill on the passive device side and the internal interconnect, the underfill having a non-horizontal underfill side coplanar with the non-horizontal device side; and a substrate on the mountable assembly.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
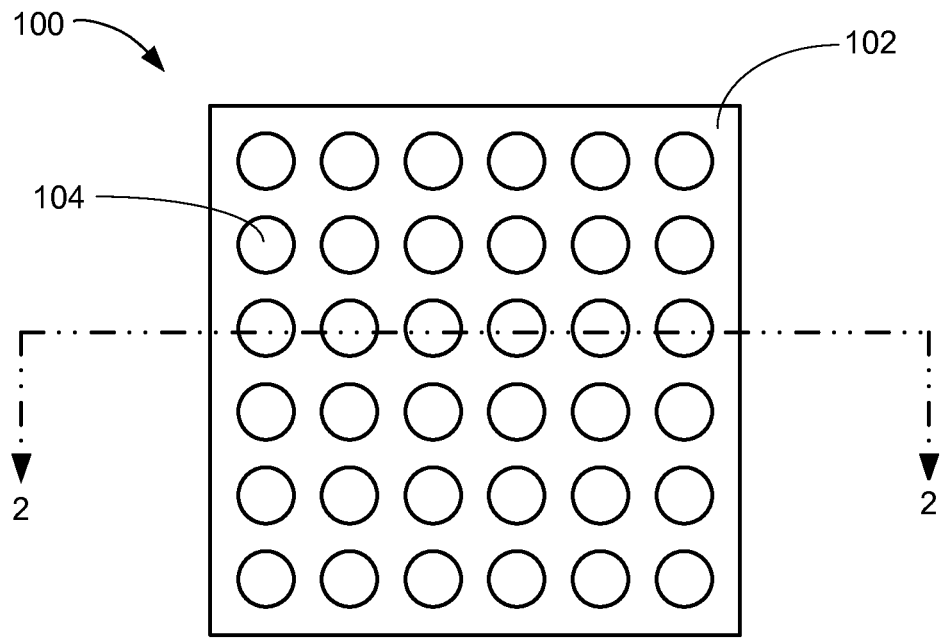
FIG. 1 is a bottom view of the integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the mountable assembly, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a bottom view of the integrated circuit packaging system 100 in a first embodiment of the present invention. The integrated circuit packaging system 100 is shown having a substrate 102 and external interconnects 104. The substrate 102 is defined as a structure containing conductive traces and contacts. For example, the substrate 102 can be a laminate substrate, a ceramic substrate, a silicon substrate, or some other laminated structure for redistribution of signals. The external interconnects 104 can be attached to the substrate 102.

The external interconnects 104 are defined as interface connectors for electrical connection to other components or next level systems (not shown). For example, the external interconnects 104 can be solder balls, solder bumps, stud bumps, pillars, or other conductive material.

Figure 2:
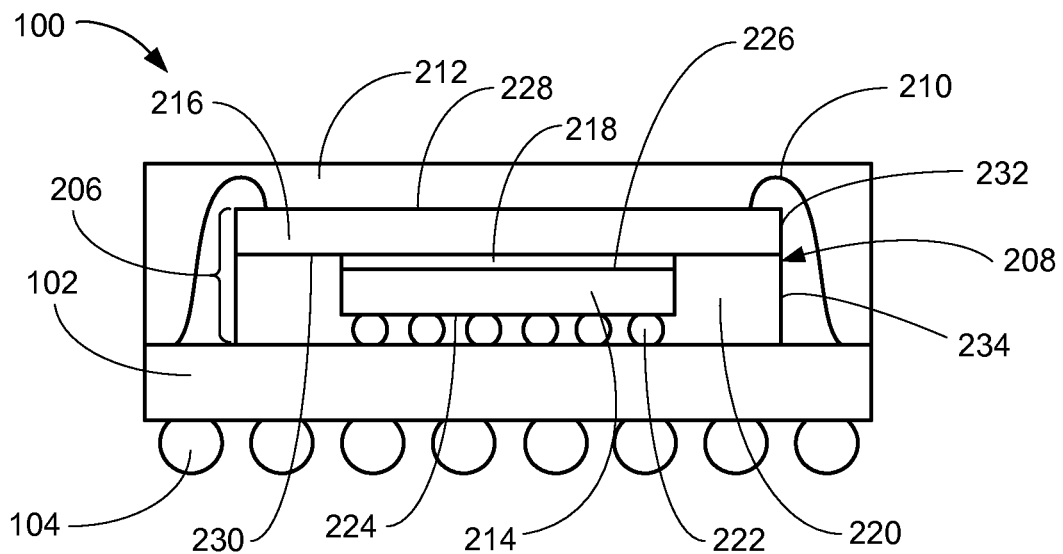
FIG. 2 is a cross-sectional view of the integrated circuit packaging system along the section line 2-2 of FIG. 1.

Referring now to FIG. 2, therein is shown a cross-sectional view of the integrated circuit packaging system 100 along the section line 2-2 of FIG. 1. The integrated circuit packaging system 100 is shown having a mountable assembly 206 having a non-horizontal planar edge 208, top interconnects 210, a package encapsulation 212, the substrate 102, and the external interconnects 104, as an example.

The mountable assembly 206 is defined as a mountable structure containing an integrated circuit. For example, the integrated circuit can be formed by singulation of a sheet of a plurality of the mountable assembly 206. The mountable assembly 206 can include a first integrated circuit die 214, an integrated circuit device 216, a die attach adhesive 218, an underfill 220, and internal interconnects 222. For example, the mountable assembly 206 can be characterized as having a planar vertical edge such as the non-horizontal planar edge 208 as a result of the singulation process.

The non-horizontal planar edge 208 is defined as the non-horizontal side of the mountable assembly 206. For example, the non-horizontal planar edge 208 can be a planar edge to the mountable assembly 206, and can be characterized by a smooth planar surface as a result of the process used to cut the edge. The process used to cut the edge can be cutting, lasering, sawing, or other singulation process, for example.

The first integrated circuit die 214 can have the internal interconnects 222, an active side 224, and a passive side 226. For example, the first integrated circuit die 214 can be a flip chip, a wire-bond chip, or other type of chip. The internal interconnects 222 are defined as electrical connectors. For example, the internal interconnects 222 can be for the first integrated circuit die 214 to connect to other components. Also for example, the internal interconnects 222 can be solder balls, solder bumps, or other conductive material used to connect the first integrated circuit die 214 to the substrate 102 or other systems.

The internal interconnects 222 can be attached to the active side 224 of the first integrated circuit die 214. The active side 224 of the first integrated circuit die 214 is defined as the side upon which circuit elements are formed and electrical connections can be made. The passive side 226 of the first integrated circuit die 214 is defined as opposite to the active side 224 and having no electrical connections. The passive side 226 of the first integrated circuit die 214 can be attached to the integrated circuit device 216 with the die attach adhesive 218.

The integrated circuit device 216 is defined as a structure having an integrated circuit. The integrated circuit device 216 can take many configurations. For example, the integrated circuit device 216 can be a semiconductor chip or an internal stacking module that includes the semiconductor chip. The integrated circuit device 216 can include a second integrated circuit die such as a wire-bond chip.

The die attach adhesive 218 is defined as a substance used to bond two or more solid elements together. The die attach adhesive 218 can be a resin, glue, paste, cement, putty, or a polyvinyl resin emulsion. The die attach adhesive 218 can cover the passive side 226 of the first integrated circuit die 214 and can attach to the integrated circuit device 216, in a back-side to back-side configuration.

The integrated circuit device 216 can include an active device side 228, a passive device side 230, and a non-horizontal device side 232. The integrated circuit device 216 can be larger than the first integrated circuit die 214, and the integrated circuit device 216 can overhang the first integrated circuit die 214. The active device side 228 is defined as the side upon which electrical connections can be made. The passive device side 230 is defined as the side opposite to the active device side 228 and having no electrical connections. The passive device side 230 of the integrated circuit device 216 can have the die attach adhesive 218 on it, connecting the passive device side 230 of the integrated circuit device 216 to the passive side 226 of the first integrated circuit die 214. The die attach adhesive 218 can partially cover the passive device side 230.

The non-horizontal device side 232 is defined as the planar non-horizontal side of the integrated circuit device 216. For example, the non-horizontal device side 232 can be the vertical side of the second integrated circuit die formed by the singulation process.

The underfill 220 is defined as a curable adhesive which also provides structural support. The underfill 220 can take many forms. For example, the underfill 220 can be a liquid or gel, and the underfill 220 can be curable by heat or electromagnetic radiation such as ultraviolet (UV) light. Also for example, the underfill 220 can be a two-stage epoxy, a B-stage material, or other curable adhesive.

The underfill 220 can cover the first integrated circuit die 214 and the passive device side 230 not already covered by the die attach adhesive 218, and can be on and between the internal interconnects 222 of the first integrated circuit die 214. The underfill 220 can fill the space between the substrate 102 and the integrated circuit device 216 and fully support the integrated circuit device 216 since the underfill 220 can fully cover the passive device side 230.

It has been discovered that the underfill 220 supporting the passive device side 230 of the integrated circuit device 216 can reduce stress on the integrated circuit device 216 during wire bonding and encapsulation. For example, the underfill 220 can prevent die bouncing during the wire bonding process when the top interconnects 210 such as bond wires are attached to the active device side 228 of the integrated circuit device 216 in spite of the integrated circuit device 216 overhanging the first integrated circuit die 214.

The underfill 220 can include a non-horizontal underfill side 234, which is defined as the non-horizontal edge of the underfill 220, from the substrate 102 to the passive device side 230 of the integrated circuit device 216. For example, the non-horizontal underfill side 234 can be coplanar with the non-horizontal device side 232. The non-horizontal underfill side 234 being coplanar with the non-horizontal device side 232 can form the non-horizontal planar edge 208 of the mountable assembly 206 because both of the non-horizontal sides are formed in the same singulation process.

It has been discovered that the non-horizontal planar edge 208 of the mountable assembly 206 being formed from the non-horizontal underfill side 234 being coplanar with the non-horizontal device side 232 results in a fully planar side for the mountable assembly 206 that eliminates contamination of adjacent contacts when mounting the mountable assembly 206. Because the underfill 220 forming the non-horizontal underfill side 234 can be cured before mounting the mountable assembly 206, the non-horizontal planar edge 208 will not deform upon mounting, preventing contamination of adjacent contacts, where, for example, the top interconnects 210 may be attached to the substrate 102.

The top interconnects 210 are defined as electrical connectors. For example, the top interconnects can be bond wires, bond ribbons, or insulated bond wires. The top interconnects 210 can attach to the active device side 228 of the integrated circuit device 216 and to contacts on the substrate 102. The top interconnects 210 can be covered by the package encapsulation 212.

It has been discovered that because the non-horizontal underfill side 234 of the underfill 220 does not spread after the mountable assembly 206 is singulated, the bonding locations of the top interconnects 210 on the substrate 102 can be moved closer to the non-horizontal planar edge 208 providing a smaller package geometry.

The package encapsulation 212 can cover the top interconnects 210, the top of the substrate 102, and the mountable assembly 206. The package encapsulation 212 can fully enclose the mountable assembly 206.

Figure 3:
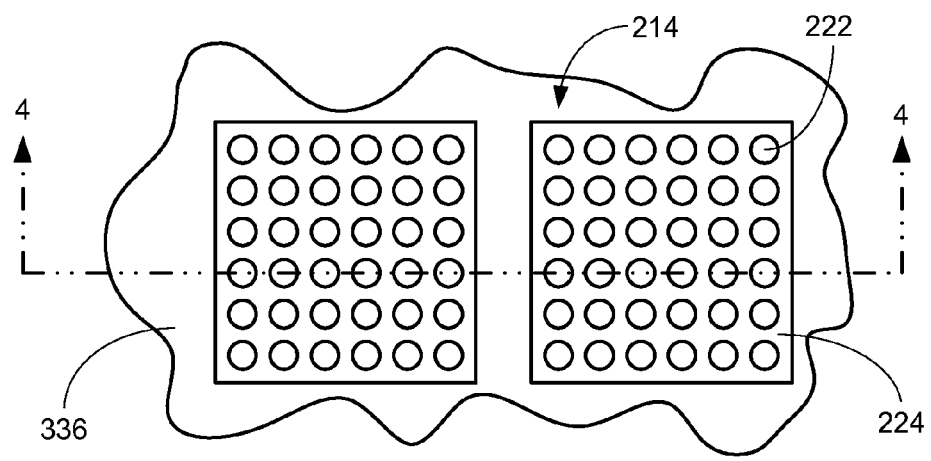
FIG. 3 is a partial top view of a wafer and a first integrated circuit die in a manufacturing step of the integrated circuit package system.

Referring now to FIG. 3, therein is shown a partial top view of a wafer 336 and the first integrated circuit die 214 in a manufacturing step of the integrated circuit packaging system 100. The wafer 336 is shown with the first integrated circuit die 214 mounted on the wafer 336 with the internal interconnects 222 on the active side 224 of the first integrated circuit die 214 visible.

The wafer 336 is defined as an array of the integrated circuit device 216 of FIG. 2. The first integrated circuit die 214 can be mounted above each instance of the integrated circuit device 216 in the wafer 336 using the die attach adhesive 218 of FIG. 2.

Figure 4:
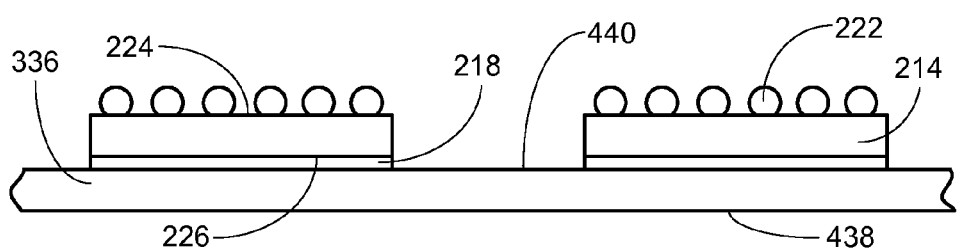
FIG. 4 is a partial cross-sectional view of the wafer and the first integrated circuit die along the line 4-4 of FIG. 3.

Referring now to FIG. 4, therein is shown a partial cross-sectional view of the wafer 336 and the first integrated circuit die 214 along the line 4-4 of FIG. 3. The wafer 336 is shown with the first integrated circuit die 214 mounted on the wafer 336 with the die attach adhesive 218.

The wafer 336 can have an active wafer side 438 and a passive wafer side 440 that correspond to the active device side 228 of FIG. 2 and the passive device side 230 of FIG. 2 of the integrated circuit device 216 of FIG. 2, respectively. The first integrated circuit die 214 can have the die attach adhesive 218 on the passive side 226 of the first integrated circuit die 214. The die attach adhesive 218 can be on the passive wafer side 440 so that the die attach adhesive 218 is between the passive side 226 of the first integrated circuit die 214 and the passive wafer side 440 of the wafer 336. The internal interconnects 222 can be formed on the active side 224 of the first integrated circuit die 214.

Figure 5:
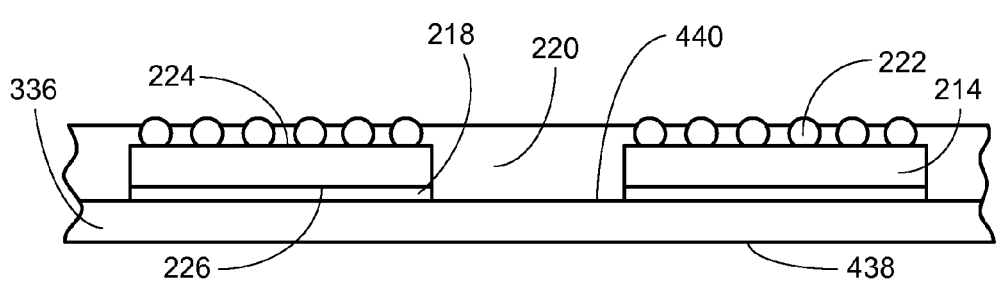
FIG. 5 is the structure of FIG. 4 in applying the underfill.

Referring now to FIG. 5, therein is shown the structure of FIG. 4 in applying the underfill 220. The wafer 336 is shown with the passive wafer side 440 completely covered by the underfill 220.

The underfill 220 can cover the first integrated circuit die 214, the passive wafer side 440, and the internal interconnects 222. The underfill 220 can leave the internal interconnects 222 partially exposed for connection to the substrate 102 of FIG. 2 or other components (not shown). The underfill 220 can be applied in many different ways. For example, the underfill 220 can be applied by processes such as spin coating, screen printing, or another process for applying the underfill 220 to a uniform height. The underfill 220 can fully cover the active side 224 of the first integrated circuit die 214 between the internal interconnects 222.

For illustrative purposes, the underfill 220 is described as leaving the internal interconnects 222 partially exposed though it is understood that the underfill 220 can be applied so as to fully cover the internal interconnects 222. For example, the underfill 220 can be a no-flow underfill, characterized by the ability of the internal interconnects 222 to push through the underfill 220 for mechanical and electrical connection. Also for example, the no-flow underfill can be used as the underfill 220 and applied in a front-side wafer level molding process in which the underfill 220 can be planarized until the internal interconnects 222 are exposed.

It has been discovered that using a no-flow underfill for the underfill 220 reduces the need for controlling the volume of the underfill 220 that is applied. An easing of the necessity for volume control of the underfill 220 can allow for greater manufacturing tolerances and increased ease of manufacture leading to higher throughput.

It has also been discovered that applying the underfill 220 on the wafer 336 and multiple instances of the first integrated circuit die 214 can reduce production time compared to applying the underfill 220 to each individual package. For example, instead of many separate processes to applying the underfill 220 to each package, applying the underfill 220 on the wafer 336 at the wafer level allows for faster production since the underfill 220 is applied to many instances of the mountable assembly 206 at the same time.

Figure 6:
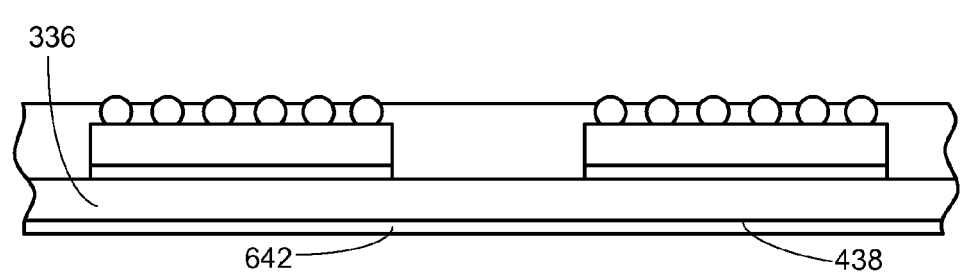
FIG. 6 is the structure of FIG. 5 in applying a dicing tape.
Figure 7:
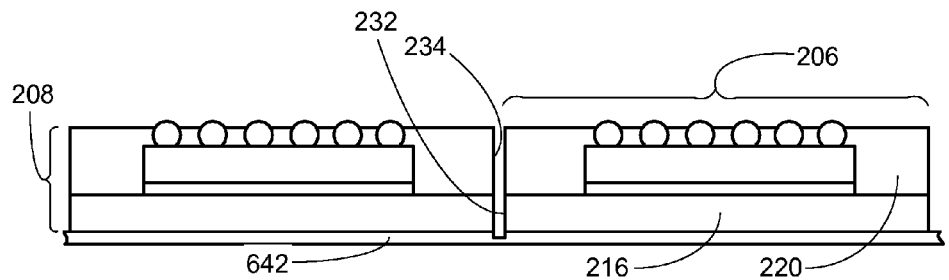
FIG. 7 is the structure of FIG. 6 in dicing through the wafer of FIG. 3 and the underfill.

Referring now to FIG. 6, therein is shown the structure of FIG. 5 in applying a dicing tape 642. The wafer 336 is shown with the dicing tape 642 on the active wafer side 438. Referring now to FIG. 7, therein is shown the structure of FIG. 6 in dicing through the wafer 336 of FIG. 3 and the underfill 220. The mountable assembly 206 is shown still on the dicing tape 642.

The mountable assembly 206 is formed by a singulation process of cutting through the underfill 220 and the integrated circuit device 216 between each instance of the first integrated circuit die 214. The singulation process can be performed in many different ways. For example, the singulation can be performed by cutting, sawing, laser ablation or cutting, shearing, or a combination thereof.

The singulation process can produce the non-horizontal planar edge 208 of the mountable assembly 206. By cutting through the underfill 220 and between the instances of the integrated circuit device 216 in a single step, the non-horizontal underfill side 234 and the non-horizontal device side 232 are coplanar, forming the non-horizontal planar edge 208 of the mountable assembly 206. The dicing tape 642 is removed from the mountable assembly 206 after singulation.

The dicing tape 642 can be removed without damaging the active wafer side 438 of the wafer 336 in many ways. For example, the dicing tape 642 can be releasable by heat, cold, ultraviolet light, or other forms of electromagnetic radiation which can reduce the adhesion strength of the dicing tape 642.

Figure 8:
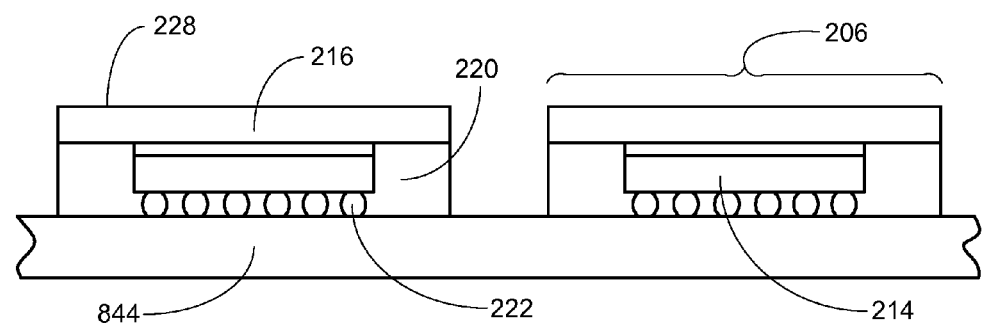
FIG. 8 is a partial cross-sectional view of the mountable assembly mounted on a base structure in a further manufacturing step of the integrated circuit packaging system.

Referring now to FIG. 8, therein is shown a partial cross-sectional view of the mountable assembly 206 mounted on a base structure 844 in a further manufacturing step of the integrated circuit packaging system 100. The mountable assembly 206 is shown with the underfill 220 and the internal interconnects 222 directly on the base structure 844. The mountable assembly 206 can be placed on the base structure 844 using a needle-less die attach process in order to avoid damaging the active device side 228 of the integrated circuit device 216.

The base structure 844 is defined as a planar structure containing multiple instances of the substrate 102 of FIG. 2. The mountable assembly 206 is mounted to leave room for later connection of the top interconnects 210 of FIG. 2.

The internal interconnects 222 of the first integrated circuit die 214 can connect to contacts (not shown) on the base structure 844 so that the underfill 220 between the internal interconnects 222 are directly on the base structure 844, leaving no gap. This connection process can occur in different ways. For example, the underfill 220 can be a b-stage material which is half-cured before attaching the mountable assembly 206, allowing the underfill 220 to conform to the surface of the base structure 844 during mounting. After attaching the mountable assembly 206, the underfill 220 can be fully cured to harden the underfill 220 in place. The underfill 220 can be a no-flow underfill.

Also for example, the connection process can reflow the internal interconnects 222 if made from solder, causing the internal interconnects 222 to conform to the shape of the contacts on the base structure 844. This can cause the mountable assembly 206 to drop down so that the underfill 220 rests directly on the base structure 844, leaving no gaps.

It has been discovered that applying the underfill 220 to the wafer 336 of FIG. 3 in a wafer level process and then mounting the mountable assembly 206 on the base structure 844 so the underfill 220 directly contacts the base structure 844 lowers the risk of the formation of voids in the underfill 220. By applying the underfill 220 before mounting, even distribution of the underfill 220 is assured, and the formation of voids during an injection process can be avoided. This is critical in the attachment of fine pitch flip chips, as the space under the flip chip is so small that the flow of injected underfill can be uneven. The application of the underfill 220 to the wafer 336 prior to mounting can avoid this problem.

It has also been discovered that using a no-flow underfill as the underfill 220 to attach the mountable assembly 206 to the base structure 844 improves the reliability of the connection between the internal interconnects 222 and the contacts (not shown) on the base structure 844. For example, because the internal interconnects 222 are fully covered by the no-flow underfill as the underfill 220, the underfill 220 can take some mechanical and thermal stress that otherwise would be entirely taken by the internal interconnects 222. The underfill 220 can service as a stress release or buffer layer so the internal interconnects 222 do not bear the full amount of stresses the internal interconnects 222 would otherwise be subjected to.

Figure 9:
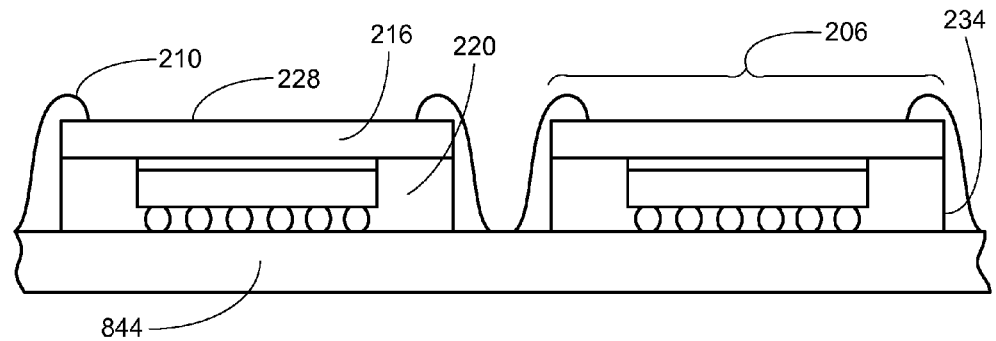
FIG. 9 is the structure of FIG. 8 in coupling the mountable assembly to the base structure.

Referring now to FIG. 9, therein is shown the structure of FIG. 8 in coupling the mountable assembly 206 to the base structure 844. The base structure 844 is shown having the top interconnects 210 attached to the base structure 844.

The top interconnects 210 can attach to the active device side 228 of the integrated circuit device 216 and electrically connect the mountable assembly 206 to the base structure 844. The top interconnects 210 can be attached adjacent to the non-horizontal underfill side 234 of the underfill 220, for example without concern for an underfill keep-out zone.

Figure 10:
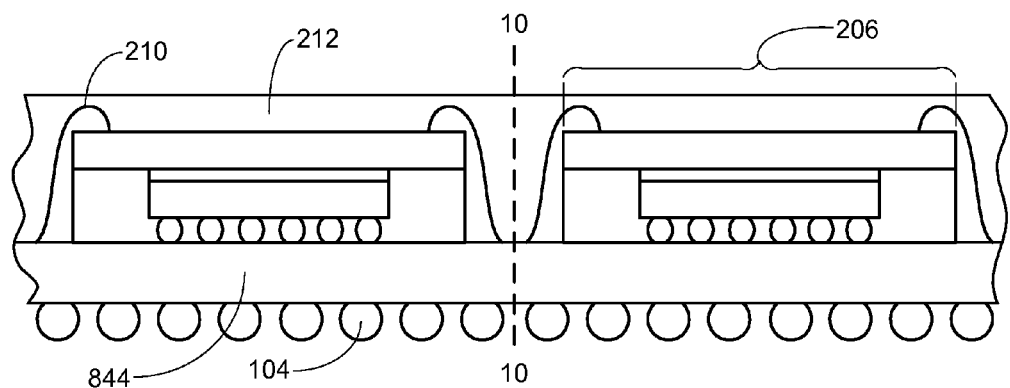
FIG. 10 is the structure of FIG. 9 in encapsulating the structure of FIG. 9.

Referring now to FIG. 10, therein is shown the structure of FIG. 9 in encapsulating the structure of FIG. 9. The integrated circuit packaging system 100 is shown before singulation along the singulation line 10-10 into individual units having the package encapsulation 212 and the external interconnects 104.

The package encapsulation 212 can be molded over the mountable assembly 206, the base structure 844, and the top interconnects 210. The package encapsulation 212 can fully cover the mountable assembly 206 and the top interconnects 210 while leaving the bottom of the base structure 844 exposed. The external interconnects 104 can be attached to the bottom of the base structure 844.

The package encapsulation 212 can be molded in many different configurations. For example, the package encapsulation 212 can be molded with a flat planar top surface or with features such as recesses which can selectively expose components in the package encapsulation 212.

The package encapsulation 212 and the base structure 844 can be singulated along the line 10-10 forming the integrated circuit packaging system 100 in a variety of ways. For example, the singulation process can be cutting, lasering, sawing, or other process for separating individual packages. The package encapsulation 212 and the base structure 844 can be cut to avoid cutting any of the top interconnects 210. Singulating the base structure 844 will create the substrate 102 of FIG. 2 under the mountable assembly 206 and can create a vertical side to the substrate 102 as a result of the singulation.

The vertical side of the package encapsulation 212 and the substrate 102 can be coplanar since the package encapsulation 212 and the substrate 102 can be created with a single cut. The vertical side of the package encapsulation 212 and the vertical side of the substrate 102 can form the vertical side of the integrated circuit packaging system 100.

Figure 11:
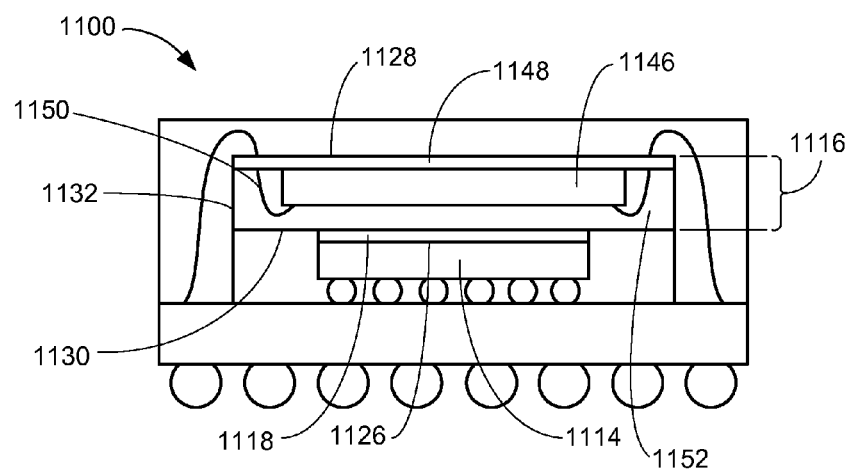
FIG. 11 is a cross-sectional view of the integrated circuit packaging system along the section line 2-2 of FIG. 1 in a second embodiment of the present invention.

Referring now to FIG. 11, therein is shown a cross-sectional view of the integrated circuit packaging system 1100 along the section line 2-2 of FIG. 1 in a second embodiment of the present invention. The integrated circuit packaging system 1100 is shown having the same features as the integrated circuit packaging system 100 of FIG. 2 with the integrated circuit package as an internal stacking module having a package integrated circuit die 1146, a top substrate 1148, inner interconnects 1150, and a device encapsulation 1152.

The integrated circuit device 1116 can include an active device side 1128, a passive device side 1130, and a non-horizontal device side 1132. The active device side 1128 is defined as the side upon which electrical connections can be made. The passive device side 1130 is defined as the side opposite to the active device side 1128 and having no electrical connections. The passive device side 1130 of the integrated circuit device 1116 can have the die attach adhesive 1118 on it, connecting the passive device side 1130 of the integrated circuit device 1116 to the passive side 1126 of the first integrated circuit die 1114. The die attach adhesive 1118 can partially cover the passive device side 1130.

The non-horizontal device side 1132 is defined as the planar non-horizontal side of the integrated circuit device 1116. The non-horizontal device side 1132 can be a planar surface due to how the non-horizontal device side 1132 was formed.

The internal stacking module can be the package integrated circuit die 1146 attached to the top substrate 1148 directly and with the inner interconnects 1150 with the device encapsulation 1152 covering the package integrated circuit die 1146 and the top substrate 1148. The device encapsulation 1152 can leave the top substrate 1148 exposed on the active device side 1128. The top substrate 1148 can be similar in composition to the substrate 102 of FIG. 2.

The device encapsulation 1152 can cover the package integrated circuit die 1146, the inner interconnects 1150, and the top substrate 1148 while leaving the top substrate 1148 exposed on the active device side 1128. The exposed portion of the top substrate 1148 can form the active device side 1128 of the integrated circuit device 1116. The side opposite the active device side 1128 can be covered by the device encapsulation 1152 which can form the passive device side 1130 of the integrated circuit device 1116.

Figure 12:
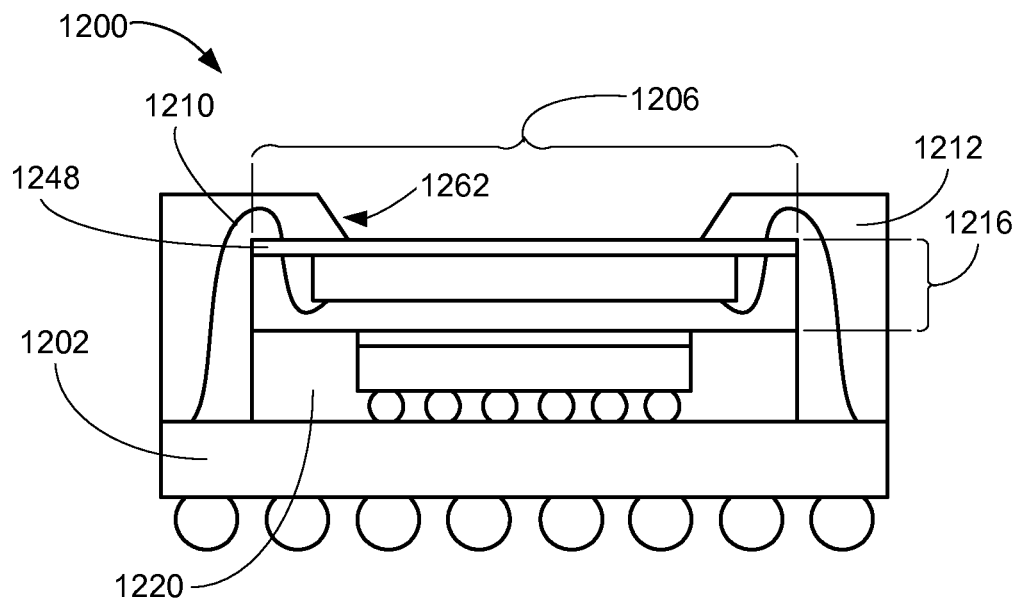
FIG. 12 is a cross-sectional view of the integrated circuit packaging system along the section line 2-2 of FIG. 1 in a third embodiment of the present invention.

Referring now to FIG. 12, therein is shown a cross-sectional view of the integrated circuit packaging system 1200 along the section line 2-2 of FIG. 1 in a third embodiment of the present invention. The integrated circuit packaging system 1200 is shown having the same features as the integrated circuit packaging system 1100 of FIG. 11 with a recess 1262 in the package encapsulation 1212.

The package encapsulation 1212 can cover the top interconnects 1210, the mountable assembly 1206, and the substrate 1202. The mountable assembly 1206 can have the integrated circuit device 1216 over the underfill 1220. The package encapsulation 1212 can have the recess 1262 in the top of the package encapsulation 1212.

The recess 1262 in the package encapsulation 1212 can leave part of the top substrate 1248 of the integrated circuit device 1216 exposed. The package encapsulation 1212 can have slanted or vertical sides inside the recess 1262. The recess 1262 can be used for mounting other components or packages (not shown) on the top substrate 1248.

Figure 13:
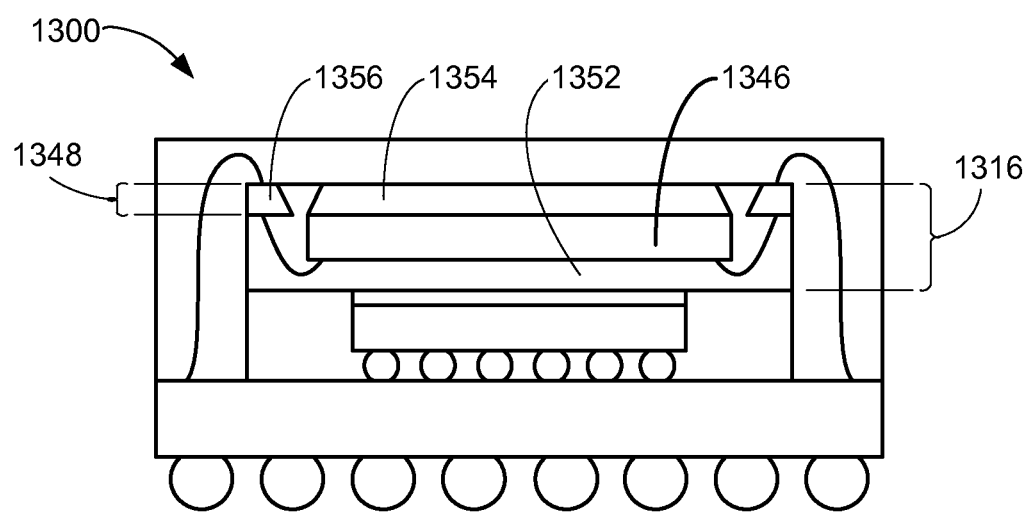
FIG. 13 is a cross-sectional view of the integrated circuit packaging system along the section line 2-2 of FIG. 1 in a fourth embodiment of the present invention.

Referring now to FIG. 13, therein is shown a cross-sectional view of the integrated circuit packaging system 1300 along the section line 2-2 of FIG. 1 in a fourth embodiment of the present invention. The integrated circuit packaging system 1300 is shown having a similar configuration to the integrated circuit packaging system 1100 of FIG. 11 with a leadframe as the top substrate 1348 for mounting the package integrated circuit die 1346.

The top substrate 1348 of the integrated circuit device 1316 can be a leadframe with a lead pad 1354 and leads 1356. The device encapsulation 1352 can be between the lead pad 1354 and the leads 1356. The lead pad 1354 and the leads 1356 can be partially covered by the device encapsulation 1352 while also being exposed from the device encapsulation 1352. The lead pad 1354 and the leads 1356 can have slanted edges in the device encapsulation 1352 that perform a mold lock function. The exposed edges of the lead pad 1354 and the leads 1356 can be coplanar with the outside edge of the device encapsulation 1352.

Figure 14:
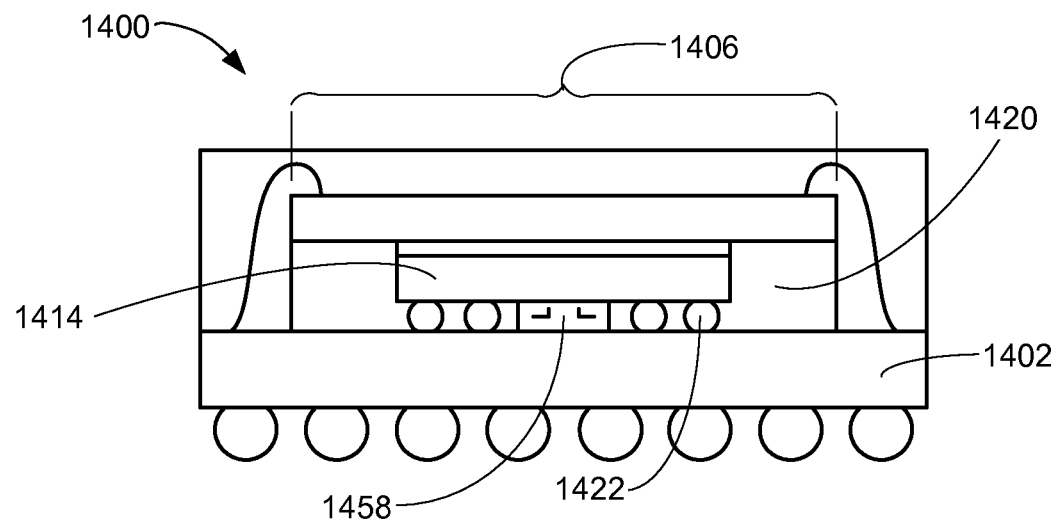
FIG. 14 is a cross-sectional view of the integrated circuit packaging system along the section line 2-2 of FIG. 1 in a fifth embodiment of the present invention.

Referring now to FIG. 14, therein is shown a cross-sectional view of the integrated circuit packaging system 1400 along the section line 2-2 of FIG. 1 in a fifth embodiment of the present invention. The integrated circuit packaging system 1400 is shown having a similar configuration to the integrated circuit packaging system 100 of FIG. 2 with the addition of a sensor device 1458 in the mountable assembly 1406.

The sensor device 1458 is defined as a self-contained peripheral device. The sensor device 1458 can take many forms. For example, the sensor device 1458 can be a microelectromechanical structure (MEMS), an accelerometer, a temperature sensor, or other sensing device.

The sensor device 1458 can be mounted between the first integrated circuit die 1414 and the substrate 1402. The sensor device 1458 can be mounted between the internal interconnects 1422. The underfill 1420 can be selectively deposited so that it does not interfere with the operation of the sensor device 1458. For example, the sensor device 1458 can be located fully under the center of the first integrated circuit die 1414 with the underfill 1420 deposited around the sensor device 1458. In order to selectively deposit the underfill 1420, the sensor device 1458 can be mounted with a barrier around the sensor device 1458.

Figure 15:
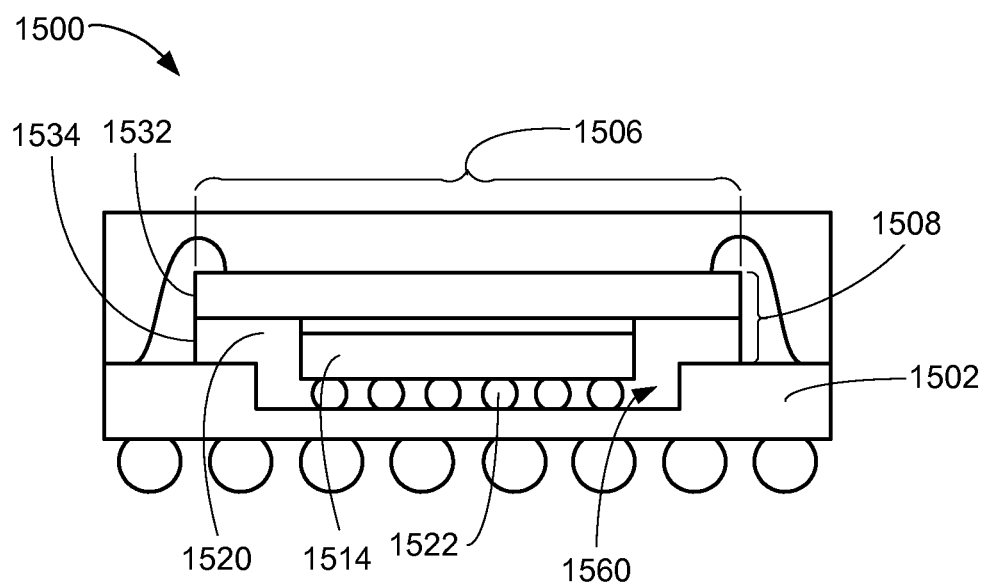
FIG. 15 is a cross-sectional view of the integrated circuit packaging system along the section line 2-2 of FIG. 1 in a sixth embodiment of the present invention.

Referring now to FIG. 15, therein is shown a cross-sectional view of the integrated circuit packaging system 1500 along the section line 2-2 of FIG. 1 in a sixth embodiment of the present invention. The integrated circuit packaging system 1500 is shown having a similar configuration to the integrated circuit packaging system 100 of FIG. 2 with a mounting cavity 1560 in the substrate 1502 allowing for a more compact package.

The substrate 1502 can have the mounting cavity 1560 in the substrate 1502. The mounting cavity 1560 is defined as a depression in the center of the substrate 1502. The mounting cavity 1560 can take a number of configurations. For example, the mounting cavity 1560 can have sides perpendicular to the horizontal surfaces of the substrate 1502 or the mounting cavity 1560 can have slanted sides.

The first integrated circuit die 1514 can be mounted in the mounting cavity 1560 with the internal interconnects 1522 on the bottom of the mounting cavity 1560. The underfill 1520 can conform to the shape of the substrate 102 of FIG. 1 and the mounting cavity 1560 so that no gaps are left between the substrate 1502 and the underfill 1520. The underfill 1520 can be shaped to conform to the shape of the substrate 102 and the mounting cavity 1560 in different ways. For example, the underfill 1520 can be cut with a multi-level saw or the underfill 1520 can be molded before curing and singulation. The underfill 1520 can have the non-horizontal underfill side 1534 coplanar with the non-horizontal device side 1532. The non-horizontal underfill side 1534 and the non-horizontal device side 1532 can form the non-horizontal planar edge 1508 of the mountable assembly 1506.

Figure 16:
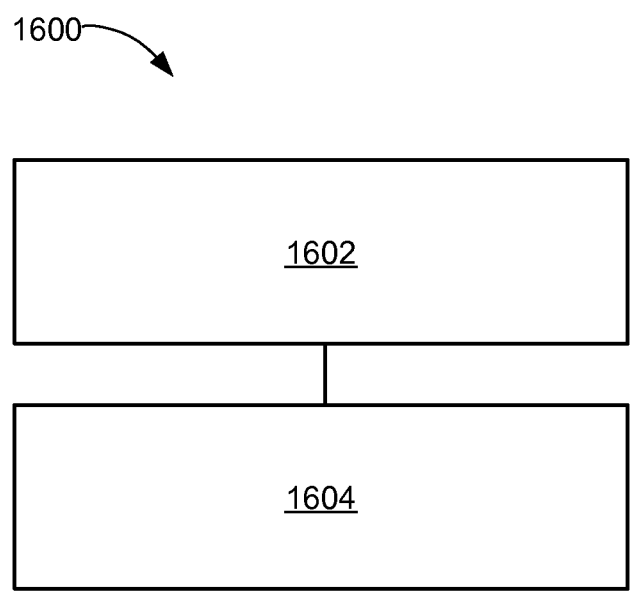
FIG. 16 is a flow chart of a method of manufacture of the integrated circuit packaging system in a further embodiment of the present invention.

Referring now to FIG. 16, therein is shown a flow chart of a method 1600 of manufacture of the integrated circuit packaging system 100 in a further embodiment of the present invention. The method 1600 includes: forming a mountable assembly in a block 1602; and mounting on a substrate the mountable assembly in a block 1604.

Thus, it has been discovered that the integrated circuit packaging system 100 and the non-horizontal planar edge 208 of the mountable assembly 206 of the present invention furnish important and heretofore unknown and unavailable solutions, capabilities, and functional aspects for reliably and efficiently manufacturing the integrated circuit packaging system 100. The package encapsulation 212 can have planar vertical sides as a result of a singulation process. The vertical sides of the package encapsulation 212 can also be coplanar with the vertical sides of the substrate 102, thereby making the vertical edge of the integrated circuit packaging system 100 a planar surface.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package comprising:
    forming a mountable assembly including:
        forming an integrated circuit device having a non-horizontal device side, an active device side, and a passive device side,
        providing a first integrated circuit die having an active side, a passive side, and an internal interconnect on the active side,
        applying a die attach adhesive on the passive side,
        attaching the passive side to the passive device side with the die attach adhesive,
        applying an underfill on the passive device side and the internal interconnect, the underfill having a non-horizontal underfill side, and
        forming a non-horizontal planar edge by singulating the mountable assembly such that the non-horizontal underfill side is coplanar with the non-horizontal device side; and
    mounting the mountable assembly on a substrate.

2. The method as claimed in claim 1 further comprising:
    attaching a top interconnect between the mountable assembly and the substrate;
    forming a package encapsulation on the mountable assembly and the substrate; and
    applying an external interconnect to the substrate.

3. The method as claimed in claim 1 wherein forming the mountable assembly includes exposing the internal interconnect from the underfill.

4. A method of manufacturing an integrated circuit package comprising:
    forming a mountable assembly including:
        forming an integrated circuit device having a non-horizontal device side, an active device side, and a passive device side,
        providing a first integrated circuit die having an active side, a passive side, and having internal interconnects on the active side,
        applying a die attach adhesive on the passive side,
        attaching the passive side to the passive device side with the die attach adhesive,
        applying an underfill on the passive device side and the internal interconnects leaving the internal interconnects exposed on the bottom of the mountable assembly, the underfill having a non-horizontal underfill side, and
        forming a non-horizontal planar edge by singulating the mountable assembly such that the non-horizontal underfill side is coplanar with the non-horizontal device side;
    mounting the mountable assembly on a substrate;
    attaching a top interconnect between the mountable assembly and the substrate;
    forming a package encapsulation on the mountable assembly and the substrate; and
    applying an external interconnect to the substrate.

5. The method as claimed in claim 4 wherein forming the integrated circuit device includes:
    providing a top substrate;
    mounting a package integrated circuit die on the top substrate; and
    forming a device encapsulation on the package integrated circuit die and the top substrate.

6. The method as claimed in claim 4 wherein forming the integrated circuit device includes:
    forming a lead pad and leads;
    attaching a package integrated circuit die to the lead pad and leads; and
    forming a device encapsulation on the package integrated circuit die, the lead pad, and the leads.

7. The method as claimed in claim 4 wherein forming the mountable assembly includes mounting a sensor device between the internal interconnects.

8. The method as claimed in claim 4 wherein mounting the mountable assembly on the substrate includes:
    forming a mounting cavity in the substrate; and
    removing the underfill from the periphery of the mountable assembly to conform to the mounting cavity.

* * * * *